US011466346B2

(12) United States Patent
Kaneko

(10) Patent No.: US 11,466,346 B2
(45) Date of Patent: Oct. 11, 2022

(54) ALUMINUM ALLOY MATERIAL, AND CONDUCTIVE MEMBER, CONDUCTIVE COMPONENT, SPRING MEMBER, SPRING COMPONENT, SEMICONDUCTOR MODULE MEMBER, SEMICONDUCTOR MODULE COMPONENT, STRUCTURAL MEMBER AND STRUCTURAL COMPONENT INCLUDING THE ALUMINUM ALLOY MATERIAL

(71) Applicant: FURUKAWA ELECTRIC CO., LTD., Tokyo (JP)

(72) Inventor: Hiroshi Kaneko, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 437 days.

(21) Appl. No.: 16/580,965

(22) Filed: Sep. 24, 2019

(65) Prior Publication Data

US 2020/0017938 A1    Jan. 16, 2020

Related U.S. Application Data

(63) Continuation of application No. PCT/JP2018/012459, filed on Mar. 27, 2018.

(30) Foreign Application Priority Data

Mar. 27, 2017  (JP) .............................. JP2017-060327
Mar. 27, 2017  (JP) .............................. JP2017-060328

(51) Int. Cl.
| | | |
|---|---|---|
| *C22C 21/08* | (2006.01) | |
| *C22F 1/04* | (2006.01) | |
| *C22F 1/047* | (2006.01) | |
| *F16F 1/02* | (2006.01) | |
| *H01B 1/02* | (2006.01) | |
| *H01L 23/00* | (2006.01) | |

(52) U.S. Cl.
CPC .............. *C22C 21/08* (2013.01); *C22F 1/047* (2013.01); *F16F 1/021* (2013.01); *H01B 1/023* (2013.01); *H01L 24/45* (2013.01); *F16F 2224/0208* (2013.01); *F16F 2228/007* (2013.01); *H01L 2224/4516* (2013.01); *H01L 2224/45123* (2013.01); *H01L 2224/45124* (2013.01); *H01L 2924/0134* (2013.01)

(58) Field of Classification Search
CPC .................................. C22C 21/08; C22F 1/047
See application file for complete search history.

(56) References Cited

U.S. PATENT DOCUMENTS

| | | |
|---|---|---|
| 2003/0165397 A1 | 9/2003 | Auran et al. |
| 2005/0019205 A1 | 1/2005 | Davisson et al. |
| 2006/0130941 A1 | 6/2006 | Litalien et al. |
| 2010/0018617 A1* | 1/2010 | Wada ...................... C22F 1/047 118/723 R |
| 2012/0103476 A1* | 5/2012 | Newman ................. C22C 21/00 420/544 |
| 2015/0316210 A1 | 11/2015 | Nakai et al. |
| 2016/0326619 A1* | 11/2016 | Bassi ...................... C22C 21/00 |

FOREIGN PATENT DOCUMENTS

| | | |
|---|---|---|
| CN | 1443249 A | 9/2003 |
| CN | 103205611 A | 7/2013 |
| CN | 105970025 A | 9/2016 |
| JP | 2000282157 A | 10/2000 |
| JP | 2000353435 A | 12/2000 |
| JP | 2004003038 A | 1/2004 |
| JP | 2006299342 A | 11/2006 |
| JP | 2007009262 A | 1/2007 |
| JP | 2012097321 A | 5/2012 |
| JP | 2013036089 A | 2/2013 |
| JP | 2014101541 A | 6/2014 |
| JP | 2014208865 A | 11/2014 |
| JP | 2015010259 A | 1/2015 |
| JP | 2016020527 A | 2/2016 |
| WO | 2004076092 A1 | 9/2004 |

OTHER PUBLICATIONS

English translation of the International Preliminary Report on Patentability received in PCT/JP2018/012459, dated Oct. 1, 2019.
English translation of the Written Opinion received in PCT/JP2018/012459, dated May 22, 2018.
Extended European Search Report received in EP application No. 18777183.7 dated Jul. 9, 2020.
English translation of Office Action for CN Application No. 201880019762.2, dated Nov. 23, 2020.
English Translation of 2nd Office Action for CN Application No. 201880019762.2, dated Aug. 25, 2021.
English Translation of Notice of Allowance received in JP App. No. 2018-532343 dated Oct. 9, 2018.
English Translation of Notice of Reasons for Refusal received in JP App. No. 2018-532343 dated Aug. 6, 2018.
International Search Report and Written Opinion received in PCT/JP2018/012459 dated May 22, 2018 (English translation of ISR only).

(Continued)

*Primary Examiner* — Jessee R Roe
(74) *Attorney, Agent, or Firm* — Dorsey & Whitney LLP

(57) ABSTRACT

An object of the present disclosure is to provide a high strength aluminum alloy material having a ribbon shape, which can be an alternative to copper-based materials and iron-based materials having a ribbon shape, and a conductive member, a conductive component, a spring member, a spring component, a semiconductor module member, a semiconductor module component, a structural member and a structural component including the aluminum alloy material. The aluminum alloy material of the present disclosure has an alloy composition containing Mg: 0.2% to 1.8% by mass, Si: 0.2% to 2.0% by mass, and Fe: 0.01% to 1.50% by mass, with the balance being Al and inevitable impurities, wherein the aluminum alloy material has a Vickers hardness (HV) of 90 or more and 190 or less and has a ribbon shape.

13 Claims, 2 Drawing Sheets

(56) References Cited

OTHER PUBLICATIONS

"Aluminum Handbook", The Corporate Judicial Person, Japan Aluminum Association, 7th edition, Jan. 31, 2007, p. 37.
[English Translation] Notice of Reasons for Refusal dated on Apr. 24, 2022 for Korean Patent Application No. 10-2019-7020169; pp. all.
[English Translation] Rejection Decision dated Dec. 14, 2021 for Chinese Patent Application No. 201880019762.2; pp. all.

* cited by examiner

ID1 ALUMINUM ALLOY MATERIAL, AND CONDUCTIVE MEMBER, CONDUCTIVE COMPONENT, SPRING MEMBER, SPRING COMPONENT, SEMICONDUCTOR MODULE MEMBER, SEMICONDUCTOR MODULE COMPONENT, STRUCTURAL MEMBER AND STRUCTURAL COMPONENT INCLUDING THE ALUMINUM ALLOY MATERIAL

CROSS REFERENCE TO RELATED APPLICATIONS

This is a continuation application of International Patent Application No. PCT/JP2018/012459 filed Mar. 27, 2018, which claims the benefit of Japanese Patent Application Nos. 2017-060327 and 2017-060328 filed Mar. 27, 2017, respectively, and the full contents of all of which are hereby incorporated by reference in their entirety.

BACKGROUND

Technical Field

The present disclosure relates to a high strength aluminum alloy material having a ribbon shape.

Description of the Related Art

Metal materials having a ribbon shape have been recently used in various applications. For example, Japanese Patent Application Publication No. 2000-282157 discloses a copper foil body made of a Cu—Ag-based alloy having a conductivity of 80% IACS or more and a tensile strength of 700 N/mm$^2$ or more, which is suitable for signal transmission cables. Furthermore, Japanese Patent Application Publication No. 2000-353435 discloses a coaxial cable made of a ribbon-shaped conductor of copper-containing metal.

As disclosed in Japanese Patent Application Publication No. 2000-282157 and Japanese Patent Application Publication No. 2000-353435, copper-based materials have been widely used as a metal material having a ribbon shape. However, reserves of copper are decreasing due to a rapid increase in demand in emerging countries. Furthermore, the content of impurities such as arsenic is increased in copper ore, and thus the tendency is that quality of copper ore is deteriorating. Moreover, in the fields of automobiles, portable electronic equipment and wearable devices, weight reduction of components is particularly required, and materials having a low specific gravity, which replace copper-based materials, are in high demand. When a copper-based material is used, it is also necessary to take measures to copper damage. The copper damage refers to a phenomenon of degradation of polymer due to a catalytic action of copper ions, which promotes an autoxidation reaction (redox reaction) of the polymer. This may cause a reduction in adhesion between rubber or plastic with copper, causing poor insulation or corrosion of copper. A typical measure to copper damage is to mix a chelating agent in polymer, but this is not very effective at high temperature. A new approach is necessary for their use in environment of higher temperature accompanied with, for example, high current.

Iron-based materials, too, cannot solve the problem of weight reduction as copper cannot. Besides, iron-based materials have the problem of poor corrosion resistance, low electrical conductivity and low heat conductivity.

Then, use of aluminum-based materials instead of copper-based materials and iron-based materials has been considered in order to solve the problems of copper-based materials and iron-based materials described above. Reserves of aluminum are abundant, and aluminum has a smaller specific gravity than copper-based materials and iron-based materials and conductivity of aluminum is high. Furthermore, the advantage of aluminum is that it has a small action of promoting autoxidation reaction of polymer. On the other hand, the problem with aluminum is that it has a lower strength and poorer fatigue life properties than copper-based materials and iron-based materials. More specifically, there has been a problem of easy deformation and a reduction in function of members and components when external force such as tension, twist or bending is applied to an aluminum-based material having a ribbon shape. Another problem was fatigue fracture during use occurring when an aluminum-based material having a ribbon shape was repeatedly deformed by external vibration or thermal expansion and contraction. For these reasons, aluminum-based materials having a ribbon shape have been used in only limited applications.

SUMMARY

The present disclosure is related to providing a high strength aluminum alloy material having a ribbon shape, which can be an alternative to copper-based materials and iron-based materials having a ribbon shape, and a conductive member, a conductive component, a spring member, a spring component, a semiconductor module member, a semiconductor module component, a structural member and a structural component including the aluminum alloy material.

According to an aspect of the present disclosure, an aluminum alloy material has an alloy composition containing Mg: 0.2 to 1.8% by mass, Si: 0.2 to 2.0% by mass, and Fe: 0.01 to 1.50% by mass, with the balance being Al and inevitable impurities. The aluminum alloy material has a Vickers hardness (HV) of 90 or more and 190 or less and has a ribbon shape.

According to another aspect of the present disclosure, an aluminum alloy material has an alloy composition containing Mg: 0.2 to 1.8% by mass, Si: 0.2 to 2.0% by mass, Fe: 0.01 to 1.50% by mass, and at least one element selected from Ti, B, Cu, Ag, Zn, Ni, Co, Au, Mn, Cr, V, Zr and Sn: 0.00 to 2% by mass in total, with the balance being Al and inevitable impurities. The aluminum alloy material has a Vickers hardness (HV) of 90 or more and 190 or less and has a ribbon shape.

According to another aspect of the present disclosure, an aluminum alloy material has an alloy composition containing Mg: 0.2 to 1.8% by mass, Si: 0.2 to 2.0% by mass, Fe: 0.01 to 1.50% by mass, and at least one element selected from Ti, B, Cu, Ag, Zn, Ni, Co, Au, Mn, Cr, V, Zr and Sn: 0.02 to 2% by mass in total, with the balance being Al and inevitable impurities. The aluminum alloy material has a Vickers hardness (HV) of 90 or more and 190 or less and has a ribbon shape.

Further, it is preferable that each of the aluminum alloy materials has a Vickers hardness (HV) of 115 or more and 190 or less.

Further, it is preferable that an end face in a width direction is in a form of a convex curved surface in the aluminum alloy materials.

Further, it is preferable that each of the aluminum alloy materials is coated with at least one metal selected from the group consisting of Cu, Ni, Ag, Sn, Au and Pd.

According to another aspect of the present disclosure, a conductive member contains the aluminum alloy material.

According to another aspect of e present disclosure, a conductive component contains the conductive member.

According to another aspect of the present disclosure, a spring member contains the aluminum alloy material.

According to another aspect of the present disclosure, a spring component contains the spring member.

According to another aspect of the present disclosure, a semiconductor module member contains the aluminum alloy material.

According to another aspect of the present disclosure, a semiconductor module component contains the semiconductor module member.

According to another aspect of the present disclosure, a structural member contains the aluminum alloy material.

According to another aspect of the present disclosure, a structural component contains the structural member.

The present disclosure can provide an aluminum alloy material having a ribbon shape and having a high strength comparable to that of copper-based materials and iron-based materials, and a conductive member, a conductive component, a spring member, a spring component, a semiconductor module member, a semiconductor module component, a structural member and a structural component including the aluminum alloy material, when the aluminum alloy material has a predetermined alloy composition and has a Vickers hardness (HV) in a pre-determined range.

DETAILED DESCRIPTION

Figure 1:
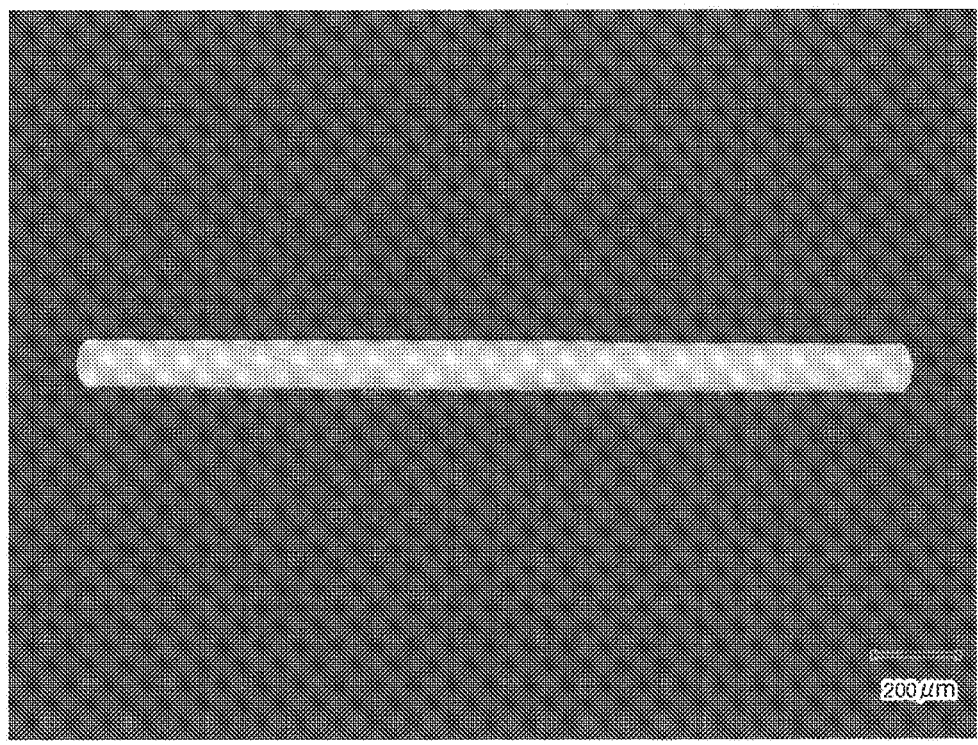
FIG. 1 is a photograph showing the aluminum alloy material of the present disclosure produced in Example 1.

Hereinafter, preferred embodiments of an aluminum alloy material of the present disclosure will be described in detail.

The aluminum alloy material of the present disclosure has an alloy composition containing Mg: 0.2 to 1.8% by mass, Si: 0.2 to 2.0% by mass, and Fe: 0.01 to 1.50% by mass, with the balance being Al and inevitable impurities, wherein the aluminum alloy material has a Vickers hardness (HV) of 90 or more and 190 or less and has a ribbon shape.

(1) Alloy Composition

The alloy composition of the aluminum alloy material of the present disclosure and its effects will be described.

<Mg: 0.2 to 1.8% by Mass>

Mg (magnesium) forms a solid solution in an aluminum matrix and thus has the effect of increasing strength, and also has the effect of improving tensile strength by the synergistic effect with Si. However, when the content of Mg is less than 0.2% by mass, the above effect is insufficient. When the content of Mg is more than 1.8% by mass, crystalized materials are formed and workability (e.g., wire drawing workability and bending workability) is reduced. Thus, the content of Mg is 0.2 to 1.8% by mass, and preferably 0.4 to 1.0% by mass.

<Si: 0.2 to 2.0% by Mass>

Si (silicon) forms a solid solution in an aluminum matrix and thus has the effect of increasing strength, and also has the effect of improving tensile strength and bending fatigue resistance by the synergistic effect with Mg. However, when the content of Si is less than 0.2% by mass, the above effect is insufficient. When the content of Si is more than 2.0% by mass, crystalized materials are formed and workability is reduced. Thus, the content of Si is 0.2 to 2.0% by mass, and preferably 0.4 to 1.0% by mass.

<Fe: 0.01 to 1.50% by Mass>

Fe (iron) is an element which forms mainly an Al—Fe-based intermetallic compound, and contributes to refining crystal grains and improves tensile strength. As used herein, the intermetallic compound refers to a compound composed of two or more metals. Only 0.05% by mass of Fe forms solid solution in Al at 655° C. The amount of solid solution to be formed is smaller at room temperature, and thus the remaining Fe which cannot form solid solution in Al crystalizes or precipitates in the form of an Al—Fe-based, Al—Fe—Si-based or Al—Fe—Si—Mg-based intermetallic compound. An intermetallic compound mainly composed of Fe and Al as those described above is called a Fe-based compound in the present specification. This intermetallic compound contributes to refining crystal grains and improves tensile strength. Fe which forms solid solution in aluminum also has the effect of improving tensile strength. When the content of Fe is less than 0.01% by mass, these effects are insufficient. When the content of Fe is more than 1.50% by mass, the amount of crystalized materials is increased and workability is reduced. In this regard, the crystalized material refers to an intermetallic compound produced when alloy is cast and solidified. Thus, the content of Fe is 0.01 to 1.50% by mass, and preferably 0.05 to 0.80% by mass. When the cooling rate in casting is low, dispersion in the Fe-based compound is sparse, and thus there may be negative effects. Thus, the content of Fe is preferably less than 1.00% by mass, and more preferably less than 0.60% by mass.

<Balance: Al and Inevitable Impurities>

The balance other than the above components includes Al (aluminum) and inevitable impurities. As used herein, inevitable impurities mean impurities included at an unavoidable level in the process of manufacture. Such inevitable impurities may cause a reduction in conductivity depending on the content, and thus it is preferable to control the content of inevitable impurities to some extent in consideration of the reduction in conductivity. Examples of components as inevitable impurities include Cr (chromium), Mn (manganese), Cu (copper), Ni (nickel), Zn (zinc), Zr (zirconium), Bi (bismuth), Pb (lead), Ga (gallium), Sn (tin) and Sr (strontium). The content of the above respective components may be 0.05% by mass or less, and the total content of the components may be 0.15% by mass or less.

Furthermore, the aluminum alloy material of the present disclosure may be coated with at least one metal selected from the group consisting of Cu, Ni, Ag, Sn, Au and Pd. The above metal also includes an alloy and an intermetallic compound composed of Cu, Ni, Ag, Sn, Au and/or Pd as a main constituent element. Coating the aluminum alloy material of the present disclosure with the above metal can improve, for example, contact resistance, soldering wettability and corrosion resistance.

The method of coating the aluminum alloy material of the present disclosure with the above metal is not particularly limited. Examples thereof include methods such as displacement plating, electrolytic plating, cladding (pressure welding) and spraying. The coating with metal is preferably thin in consideration of weight reduction and the like, and thus of the above methods, displacement plating and electrolytic plating are particularly preferred. The aluminum alloy material may be coated with the above metal and then subjected to wire drawing working and/or rolling working. Furthermore, when the crystal orientation of the aluminum alloy material of the present disclosure which has been coated with the above metal is measured by X rays and the like, the metal coating is removed and then the crystal orientation is measured on the surface of the aluminum alloy material.

The aluminum alloy material of the present disclosure has an alloy composition containing Mg: 0.2 to 1.8% by mass, Si: 0.2 to 2.0% by mass, Fe: 0.01 to 1.50% by mass, and at least one element selected from Ti, B, Cu, Ag, Zn, Ni, Co, Au, Mn, Cr, V, Zr and Sn: 0.00 to 2% by mass in total, with the balance being Al and inevitable impurities, wherein the aluminum alloy material has a Vickers hardness (HV) of 90 or more and 190 or less and has a ribbon shape. Furthermore, the aluminum alloy material of the present disclosure has an alloy composition containing Mg: 0.2 to 1.8% by mass, Si: 0.2 to 2.0% by mass, Fe: 0.01 to 1.50% by mass, and at least one element selected from Ti, B, Cu, Ag, Zn, Ni, Co, Au, Mn, Cr, V, Zr and Sn: 0.02 to 2% by mass in total, with the balance being Al and inevitable impurities, wherein the aluminum alloy material has a Vickers hardness (HV) of 90 or more and 190 or less and has a ribbon shape. "At least one element selected from Ti, B, Cu, Ag, Zn, Ni, Co, Au, Mn, Cr, V, Zr and Sn: 0.00% by mass in total" means that at least one element selected from Ti, B, Cu, Ag, Zn, Ni, Co, Au, Mn, Cr, V, Zr and Sn is substantially not contained.

(1) Alloy Composition

The alloy composition of the aluminum alloy material of the present disclosure and its effects will be described.

<Mg: 0.2 to 1.8% by Mass>

Mg (magnesium) forms solid solution in aluminum matrix and thus has the effect of increasing strength, and also has the effect of improving tensile strength by the synergistic effect with Si. However, when the content of Mg is less than 0.2% by mass, the above effect is insufficient. When the content of Mg is more than 1.8% by mass, crystalized materials are formed and workability (e.g., wire drawing workability and bending workability) is reduced. Thus, the content of Mg is 0.2 to 1.8% by mass, and preferably 0.4 to 1.0% by mass.

<Si: 0.2 to 2.0% by Mass>

Si (silicon) forms solid solution in aluminum matrix and thus has the effect of increasing strength, and also has the effect of improving tensile strength and bending fatigue resistance by the synergistic effect with Mg. However, when the content of Si is less than 0.2% by mass, the above effect is insufficient. When the content of Si is more than 2.0% by mass, crystalized materials are formed and workability is reduced. Thus, the content of Si is 0.2 to 2.0% by mass, and preferably 0.4 to 1.0% by mass.

<Fe: 0.01 to 1.50% by Mass>

Fe (iron) is an element which forms mainly an Al—Fe-based intermetallic compound, and contributes to refining crystal grains and improves tensile strength. As used herein, the intermetallic compound refers to a compound composed of two or more metals. Only 0.05% by mass of Fe forms solid solution in Al at 655° C. The amount of solid solution to be formed is smaller at room temperature, and thus the remaining Fe which cannot form solid solution with Al crystalizes or precipitates in the form of an Al—Fe-based, Al—Fe—Si-based or Al—Fe—Si—Mg-based intermetallic compound. An intermetallic compound mainly composed of Fe and Al as those described above is called a Fe-based compound in the present specification. This intermetallic compound contributes to refining crystal grains and improves tensile strength. Fe which forms solid solution in aluminum also has the effect of improving tensile strength. When the content of Fe is less than 0.01% by mass, these effects are insufficient. When the content of Fe is more than 1.50% by mass, the amount of crystalized materials is increased and workability is reduced. In this regard, the crystalized material refers to an intermetallic compound produced when alloy is cast and solidified. Thus, the content of Fe is 0.01% to 1.50% by mass, and preferably 0.05% to 0.23% by mass. The content is particularly preferably 0.05 to 0.17% by mass when moldability into a ribbon shape is considered important.

<At Least One Element Selected from Ti, B, Cu, Ag, Zn, Ni, Co, Au, Mn, Cr, V, Zr and Sn: 0.00 to 2% by Mass in Total>

Ti (titanium), B (boron), Cu (copper), Ag (silver), Zn (zinc), Ni (nickel), Co (cobalt), Au (gold), Mn (manganese), Cr (chromium), V (vanadium), Zr (zirconium) and Sn (tin) are all an element which improves heat resistance. One of these components may be contained alone or two or more of them may be contained in combination. It is preferable that at least one element selected from Zn, Ni, Co, Mn, Cr, V, Zr and Sn be contained in consideration of corrosion resistance in the case of using in a corrosive environment. The above "contained" means that the amount is more than 0.00% by mass.

Examples of mechanisms of improvement in heat resistance by the above elements include a mechanism of reducing crystal grain boundary energy due to a large difference between the atomic radius of the above elements and the atomic radius of aluminum, a mechanism of reducing mobility of grain boundaries due to high diffusion coefficient of the above elements when they enter the grain boundary, and a mechanism of delaying the phenomenon of diffusion by trapping defects due to their strong interaction with defects. These mechanisms are considered to act synergistically.

When the total content of the above components is less than 0.02% by mass, heat resistance is insufficient. Furthermore, when the content of these components is more than 2% by mass, workability is reduced. Thus, the total content of at least one element selected from Ti, B, Cu, Ag, Zn, Ni, Co, Au, Mn, Cr, V, Zr and Sn is preferably 0.02 to 2% by mass, more preferably 0.06 to 2% by mass, and particularly preferably 0.3 to 1.2% by mass.

<Balance: Al and Inevitable Impurities>

The balance other than the above components includes Al (aluminum) and inevitable impurities. As used herein, inevitable impurities mean impurities included at an unavoidable level in the process of manufacture. Such inevitable impurities may cause a reduction in conductivity depending on the content, and thus it is preferable to control the content of inevitable impurities to some extent in consideration of the reduction in conductivity. Examples of components as inevitable impurities include Bi (bismuth), Pb (lead), Ga (gallium), and Sr (strontium). The content of the above respective components may be 0.05% by mass or less, and the total content of the components may be 0.15% by mass or less.

Furthermore, the aluminum alloy material of the present disclosure may be coated with at least one metal selected from the group consisting of Cu, Ni, Ag, Sn, Au and Pd. The above metal also includes an alloy and an intermetallic compound composed of Cu, Ni, Ag, Sn, Au and/or Pd as a main constituent element. Coating the aluminum alloy material of the present disclosure with the above metal can improve, for example, contact resistance, soldering wettability and corrosion resistance.

The method of coating the aluminum alloy material of the present disclosure with the above metal is not particularly limited. Examples thereof include methods such as displacement plating, electrolytic plating, cladding (pressure welding) and spraying. The coating with metal is preferably thin in consideration of weight reduction and the like, and thus of the above methods, displacement plating and electrolytic plating are particularly preferred. The aluminum alloy material may be coated with the above metal and then subjected to wire drawing working and/or rolling working. Furthermore, when the crystal orientation of the aluminum alloy material of the present disclosure which has been coated with the above metal is measured by X rays and the like, the metal coating is removed and then the crystal orientation is measured on the surface of the aluminum alloy material.

Such an aluminum alloy material can be obtained by combining and controlling alloy compositions and manufacturing methods. Hereinafter, a suitable method of manufacturing the aluminum alloy material of the present disclosure will be described.

(2) Method of Manufacturing Aluminum Alloy Material According to One Example of the Present Disclosure Aluminum alloys such as Al—Mg—Si-based alloys have been usually produced by precipitation and hardening by combining solution heat treatment and aging precipitation heat treatment. The method of manufacturing is also called T6 treatment. The level of strength obtained by the method of manufacturing was lower than the level of strength of copper-based materials and iron-based materials. Thus, the method of manufacturing of the present disclosure is significantly different from the method of manufacturing involving precipitation and hardening of Mg—Si-based compounds, which has been usually used for preparing conventional aluminum alloy materials, in the approach of achieving high strength.

In a preferred method of manufacturing the aluminum alloy material of the present disclosure, an aluminum alloy raw material having a predetermined alloy composition is subjected to wire drawing working [1] and rolling working [2]. Details will be described below.

Aluminum alloy raw materials used in wire drawing working [1] are not particularly limited as long as they have the above alloy composition. For example, an extruded material, an ingot material, a hot-rolled material and a cold-rolled material may be selected according to the purpose of use. The degree of working η in wire drawing working [1] is preferably 5 or more, more preferably 6 or more, and further preferably 7 or more. The upper limit of the degree of working, which is not particularly limited, is usually 15.

Degree of working η is represented by the logarithm of the ratio of areas as in the following equation (1) in which s1 represents the cross-sectional area before working and s2 (s1>s2) represents the cross-sectional area after working.

$$\text{Degree of working (non-dimension): } \eta = \ln(s1/s2) \quad (1)$$

Working rate R is preferably set to 98.2% or more, and more preferably 99.8% or more. Working rate R is represented by the following equation (2) using s1 and s2 described above.

$$\text{Working rate (\%): } R = \{(s1-s2)/s1\} \times 100 \quad (2)$$

In the present disclosure, aging precipitation heat treatment [0] which has been conventionally performed before wire drawing working [1] is not performed. In such aging precipitation heat treatment [0], aluminum alloy raw materials are usually maintained at 160 to 240° C. for 1 minute to 20 hours to promote precipitation of an Mg—Si compound. However, when an aluminum alloy raw material is treated with aging precipitation heat treatment [0], and subjected to wire drawing working [1] at high degree of working as described above and subsequent rolling working [2], working cracks occurs in the inside of the material.

Rolling working [2] is performed after wire drawing working [1]. In rolling working [2], a wire rod prepared by wire drawing working [1] is worked so that the wire rod has a ribbon shape. Methods of preparing an aluminum alloy material having a ribbon shape also includes a method in which a wide plate is subjected to slit working. The slit working is a method of cutting by applying shear deformation to a material between tools disposed at a very small clearance. The thinner the material, the more precisely the clearance needs to be controlled. Then, when the clearance is too small, sagging of the material which has been cut is increased. Large sagging results in insufficient conductive properties and mechanical properties. Conversely, when the clearance is too large, burr is generated. Burr may cause short circuit in the inside of electric components. Thus, in the present disclosure, it is preferable that the aluminum alloy material having a ribbon shape be produced by the method in which rolling working [2] is performed after wire drawing working [1].

Width expansion ratio S in rolling working [2] is preferably 1.4 to 6.0, more preferably 1.7 to 5.0, further preferably 2.0 to 4.0, and most preferably 2.3 to 3.5. Width expansion ratio S is represented by the following equation (3) in which D represents the diameter of an aluminum alloy material (wire rod) after wire drawing working [1] and W represents the width of the aluminum alloy material after rolling working [2] having a ribbon shape.

$$\text{Width expansion ratio } S = W/D \quad (3)$$

In the present disclosure, drawing working [3] may be performed after rolling working [2]. Drawing working [3] is performed by drawing a rolled aluminum alloy material through a die. In the present disclosure, refine annealing [4] may also be performed after rolling working [2] or drawing working [3] in order to release residual stress and improve elongation. Refine annealing [4] is preferably performed at a treatment temperature of 50 to 160° C. for a retention time of 1 to 48 hours. When the treatment temperature of refine annealing [4] is less than 50° C., the effect of releasing residual stress and improving elongation is unlikely to be achieved. When the temperature is more than 160° C., crystal grains grow due to recovery and recrystallization and thus the strength tends to be reduced. These conditions of heat treatment may be appropriately adjusted according to the type and the amount of inevitable impurities and the state of solid solution/precipitation of the aluminum alloy raw material to be used.

In the present disclosure, the aluminum alloy raw material is worked at high degree of working. Therefore, as a result, an elongated aluminum alloy material having a ribbon shape is obtained. By contrast, it is difficult to obtain this shape by a conventional method for manufacturing an aluminum alloy material, such as powder sintering, compression torsion working, High Pressure Torsion (HPT), forge working, or Equal Channel Angular Pressing (ECAP). The length of the aluminum alloy material of the present disclosure is preferably 10 m or more. The upper limit of the length of the aluminum alloy material in manufacturing is not particularly limited, and is preferably 6,000 m in consideration of workability and the like.

Furthermore, increasing the degree of working is effective for the aluminum alloy material of the present disclosure as described above. Thus, the smaller the thickness the more easily the configuration of the present disclosure is achieved. The thickness is preferably 1 mm or less, more preferably 0.5 mm or less, further preferably 0.1 mm or less, and particularly preferably 0.07 mm or less. The upper limit of the thickness is not particularly limited and is preferably 30 mm.

Furthermore, while the aluminum alloy material of the present disclosure is worked to be thin as described above, a plurality of such aluminum alloy materials may be prepared and joined to be thick and the resultant may be used for the intended purpose. A known method may be used as the method of joining, and examples thereof include pressure welding, welding, joining using an adhesive, and friction stirring joining.

The surface of aluminum alloy material of the present disclosure may be coated with another metal such as copper, nickel, tin, silver or gold in order to improve corrosion resistance and solderability. Examples of methods of coating include pressure welding and plating. Coating an aluminum alloy material is also effective for improving fatigue life.

(3) Characteristics of Aluminum Alloy Material of the Present Disclosure

The aluminum alloy material of the present disclosure has a ribbon shape. The "ribbon shape" means a flat and elongated shape, and may also be referred to as a tape or a strip shape. It is preferable that the width of the aluminum alloy material of the present disclosure having a ribbon shape be 1.5 times or more the thickness. The width and the thickness of the aluminum alloy material are measured at a plurality of sites and the ratio of the width to the thickness may be calculated by using the mean value of the widths and the mean value of the thicknesses. Here, the width refers to the length in the direction perpendicular to the longitudinal direction of the aluminum alloy material. As described later, end faces of the aluminum alloy material of the present disclosure in the width direction may be in the form of a convex curved surface. In that case, the distance between the apexes of the convex curved surfaces on both end faces is defined as the width. When the ratio of the width to the thickness is less than 1.5 times and end faces in the width direction are in the form of a convex curved surface, the effect caused by that form, which will be described later, is insufficient. The ratio of the width to the thickness is preferably 4 times or more, more preferably 8 times or more, and most preferably 12 times or more. The upper limit of the ratio is not particularly limited and is usually 30 times.

Figure 2:
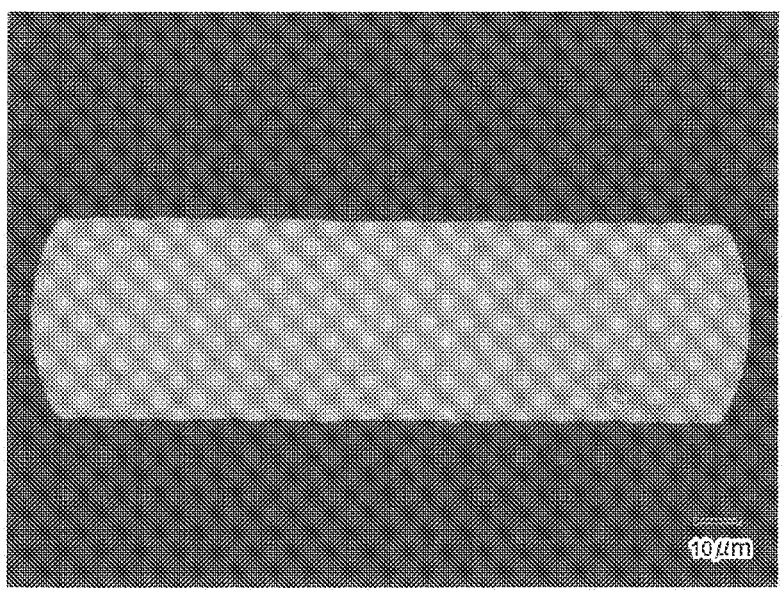
FIG. 2 is a photograph showing the aluminum alloy material of the present disclosure produced in Example 17.

It is preferable that the end faces in the width direction of the aluminum alloy material of the present disclosure be in the form of a convex curved surface as shown in FIGS. 1, 2. The end face in the width direction means an end face in the direction perpendicular to the longitudinal direction. It is preferable that the end face in the width direction be more specifically in the form of an outward convex curve. The convex curved surface may be a curved face of a circular arc having a certain curvature, or a curved surface of a plurality of circular arcs connected. When an aluminum alloy material having a ribbon shape is produced by wire drawing working [1] and rolling working [2] as in the method of manufacturing described above, the end faces in the width direction of the aluminum alloy material are formed into a convex curved surface. By contrast, when an aluminum alloy material having a ribbon shape is produced by a method in which a wide plate is subjected to slit working, the end faces in the width direction are in a planar shape perpendicular to the surface of the plate, not in a curved shape. This curved end face in the width direction has the effect of dispersing stress of bending or torsion applied to the end face of the material and thus preventing fatigue fracture caused by stress concentration.

(4) Characteristics of Aluminum Alloy Material of the Present Disclosure

[Vickers Hardness (HV)]

The aluminum alloy material of the present disclosure has a Vickers hardness (HV) of 90 to 190. A Vickers hardness (HV) of 90 means a strength comparable to that of copper-based materials and iron-based materials. In other words, the aluminum alloy material of the present disclosure has the same or higher strength than copper-based materials and iron-based materials. The aluminum alloy material of the present disclosure has a Vickers hardness (HV) of preferably 105 or more, more preferably 115 or more, further preferably 130 or more, and still more preferably 145 or more, and most preferably 160 or more. A Vickers hardness (HV) of more than 190 is not preferred because working cracks are easily formed to reduce productivity.

Having a Vickers hardness (HV) of 90 or more indicates that fatigue life equal to or higher than that of copper-based materials can be achieved. Furthermore, having a Vickers hardness (HV) of 115 or more indicates that fatigue life of 2 times or more that of copper-based materials can be achieved. This corresponds to a tensile strength of about 430 MPa or more. Thus, an aluminum alloy material having a Vickers hardness (HV) of 115 or more is most suitable as, for example, a member for wearable devices in which strain is likely to occur due to repeated bending, and a member near an engine or a motor in which strain is likely to occur due to vibration.

Vickers hardness (HV) is measured in accordance with JIS Z 2244:2009. For the measurement of Vickers hardness (HV) of a worked product which has already been formed into a member or a component, the product may be disassembled and the cross-section may be mirror-polished to measure the Vickers hardness of the cross-section.

[Conductivity]

It is preferable that the aluminum alloy material of the present disclosure that has an alloy composition containing Mg: 0.2 to 1.8% by mass, Si: 0.2 to 2.0% by mass, and Fe: 0.01 to 1.50% by mass, with the balance being Al and inevitable impurities, and also has a Vickers hardness (HV) of 90 or more and 190 or less and has a ribbon shape, has a conductivity of 40% IACS or more. The aluminum alloy material of the present disclosure has a conductivity of more preferably 45% IACS or more, further preferably 50% IACS or more, and most preferably 55% IACS or more. Conductivity may be measured by a four-terminal method.

(5) Application of Aluminum Alloy Material of the Present Disclosure

The aluminum alloy material of the present disclosure may be applied to various members and components in which an iron-based material, a copper-based material and an aluminum-based material are used. The member refers to a product prepared by primary working (e.g., punching, bending and plating) of an aluminum alloy material. The component refers to a product obtained by assembling a member. Specifically the aluminum alloy material of the present disclosure may be used for a conductive member, a conductive component, a spring member, a spring component, a semiconductor module member, a semiconductor module component, a structural member and a structural component.

Examples of conductive members include electric wires and cables. Examples of conductive components made of a conductive member include a power electric wire such as an overhead power line, OPGW, an underground electric wire, or a submarine cable, a communication electric wire such as a telephone cable or a coaxial cable, an appliance electric wire such as a cable for a wired drone, a cab tire cable, a charging cable for an EV and HEV, a twisted cable for offshore wind power generation, an elevator cable, an umbilical cable, a robot cable, a train overhead wire, or a trolley wire, a transportation electric wire such as an automobile wire harness, a marine electric wire, and an electric wire for aircraft, a bus bar, a lead frame, a flexible flat cable, a lightning rod, an antenna, a connector, and a terminal.

Examples of spring members include a coil spring and a blade spring. Examples of spring components made of a spring member include a connector, a switch, a terminal and a spiral spring.

Examples of semiconductor module members include a conductor. Examples of semiconductor module components made of a semiconductor module member include a flat bonding wire.

Examples of structural members include a structural plate material, a structural square bar and a structural profile. Examples of structural components made of a structural member include a scaffold in a construction site, a conveyor mesh belt, a metal fiber for clothing, a chain armor, a fence, an insect repellent net, a zipper, a fastener, a clip, aluminum wool, a bicycle component such as a brake wire or a spoke, a reinforcement wire for tempered glass, a pipe seal, a metal gasket, a material for protecting and reinforcing cable, a core metal for fan belt, a wire for driving an actuator, a chain, a hanger, a sound proof mesh, and a shelf board.

With the recent growth of the advanced information society, copper wires with a braided structure have been used as a shield wire in cables for data transmission. Weight reduction of such shield wires can also be achieved by using the aluminum alloy material having a ribbon shape of the present disclosure.

The aluminum alloy material having a ribbon shape according to the present disclosure may be twisted with a wire rod of other materials such as copper, copper alloy, aluminum, aluminum alloy, iron and iron alloy to form a structure of a twisted wire where necessary.

What has been described above only illustrates several embodiments of the present disclosure and may be modified in various ways within the scope of the claims.

EXAMPLES

Hereinafter the present disclosure will be described in more detail with reference to Examples, but the present disclosure is not limited thereto.

Examples 1 to 13, Comparative Examples 1 to 6

First, 10 mm ϕ bars having the alloy composition shown in Table 1 were prepared in Examples 1 to 13 and Comparative Examples 2 to 6. A 10 mm ϕ bar made of 99.99% by mass of Al was prepared in Comparative Example 1. Next, an aluminum alloy material having a ribbon shape was produced under the manufacturing condition shown in Table 1 using the respective bars.

Manufacturing conditions A to J shown in Table 1 are specifically as follows. The degree of working and width expansion ratio S are as shown in equation (1) and equation (3) above.

<Manufacturing Condition A>

The bar prepared was subjected to wire drawing working [1] at a degree of working of 5.5. Then, rolling working [2] was performed at a width expansion ratio S of 3.0. Finishing drawing working [3] and refine annealing [4] were not performed. The ratio of the width to the thickness of the aluminum alloy material produced was 15 times.

<Manufacturing Condition B>

An aluminum alloy material was produced under the same condition as in Manufacturing condition A except that the degree of working in wire drawing working [1] was 6.5. The ratio of the width to the thickness of the aluminum alloy material produced was 10 times.

<Manufacturing Condition C>

The bar prepared was subjected to wire drawing working [1] at a degree of working of 7.5. Then, rolling working [2] was performed at a width expansion ratio S of 2.5. Finishing drawing working [3] and refine annealing [4] were not performed. The ratio of the width to the thickness of the aluminum alloy material produced was 6 times.

<Manufacturing Condition D>

The bar prepared was subjected to wire drawing working [1] at a degree of working of 10.0. Then, rolling working [2] was performed at a width expansion ratio S of 2.0. Finishing drawing working [3] and refine annealing [4] were not performed. The ratio of the width to the thickness of the aluminum alloy material produced was 3 times.

<Manufacturing Condition E>

The bar prepared was subjected to wire drawing working [1] at a degree of working of 5.5. Then, rolling working [2] was performed at a width expansion ratio S of 3.0. Finishing drawing working [3] was not performed. Refine annealing [4] was performed at 155° C. for 40 hours. The ratio of the width to the thickness of the aluminum alloy material produced was 15 times.

<Manufacturing Condition F>

The bar prepared was subjected to wire drawing working [1] at a degree of working of 6.5. Then, rolling working [2] was performed at a width expansion ratio S of 3.0. Then, finishing drawing working [3] was performed and refine annealing [4] was performed at 140° C. for 1 hour. The ratio of the width to the thickness of the aluminum alloy material produced was 10 times.

<Manufacturing Condition G>

The bar prepared was subjected to wire drawing working [1] at a degree of working of 7.5. Then, rolling working [2] was performed at a width expansion ratio S of 2.5. Finishing drawing working [3] was not performed. Refine annealing [4] was performed at 80° C. for 24 hours. The ratio of the width to the thickness of the aluminum alloy material produced was 6 times.

<Manufacturing Condition H>

The bar prepared was subjected to wire drawing working [1] at a degree of working of 10. Then, rolling working [2] was performed at a width expansion ratio S of 2.0. Finishing drawing working [3] was not performed. Refine annealing [4] was performed at 100° C. for 24 hours. The ratio of the width to the thickness of the aluminum alloy material produced was 3 times.

<Manufacturing Condition I>

An aluminum alloy material was produced under the same condition as in Manufacturing condition E except that the degree of working in wire drawing working [1] was 2.0. The ratio of the width to the thickness of the aluminum alloy material produced was 15 times.

<Manufacturing Condition J>

The bar prepared was subjected to aging precipitation heat treatment [0] at a treatment temperature of 180° C. for a retention time of 5 hours. Subsequently, the bar was subjected to wire drawing working [1] at a degree of working of 5.5 and rolling working [2] at a width expansion ratio S of 3.5. In Comparative Example 6, working cracks occurred at many portions during rolling working [2] and thus the work was discontinued.

<Manufacturing Condition K>

The bar prepared was subjected to wire drawing working [1]. In Comparative Examples 3, 4, working cracks occurred at many portions during wire drawing working [1] and thus the work was discontinued.

[Evaluation]

Properties of the aluminum alloy materials according to Examples and Comparative Examples above were evaluated as shown below. Conditions of evaluation of the respective properties are as follows. The results are shown in Table 1.

[1] Alloy Composition

The alloy composition was analyzed by emission spectroscopy according to JIS H1305:2005. The measurement was performed using an emission spectrophotometer (manufactured by Hitachi High-Tech Science Corporation).

[2] Vickers Hardness (HV)

Vickers hardness (HV) was measured by using microhardness tester HM-125 (manufactured by Akashi Corporation (current Mitutoyo Corporation)) according to JIS Z2244:2009. In the test, the test force was 0.1 kgf (0.98 N) and the retention time was 15 seconds. The measurement position was a position near the middle between the center and the surface layer in a cross-section parallel to the longitudinal direction of the aluminum alloy material produced (a position to the center by about ¼ from the surface layer). The average value of the measured values at 5 positions was calculated. When the difference between the maximum and the minimum of the measured values was 10 or more, the number of the materials to be measured was increased, and the average value of the measured values at 10 positions was calculated. The higher the Vickers hardness (HV), the better. A Vickers hardness (HV) of 90 or more was determined as acceptable in the present Examples.

[3] Tensile Strength

A tensile test was performed according to JIS Z2241:2011 using a precision universal tester (manufactured by Shimadzu Corporation) to measure tensile strength (MPa). The above test was performed in a condition of a distance between measured points of 10 cm and a deformation rate of 10 mm/minute. The tensile strength of three pieces of the respective aluminum alloy materials was measured and the average value thereof was calculated. The higher the tensile strength, the better. A tensile strength of 350 MPa or more was determined as acceptable in the present Examples.

[4] Fatigue Cycle

A test was performed in an alternating condition according to Technical Standard JCBA-T308 (2002) of the Japan Copper and Brass Association. For set length L of the specimen, a condition of applying a bending stress of 300 MPa to a copper-based material having a Young's modulus of 125 GPa was used. L is represented as:

$$L = 36.06 \times \sqrt{t} \quad (4)$$

Using the square root of plate thickness t. For the aluminum alloy materials produced, number of repetitions $N_A$ until the material was broken in the above condition was determined. Next, a tough pitch copper having a ribbon shape was subjected to a measurement under the same condition to determine number of repetitions $N_C$. Then, the ratio of the two, P, was calculated as in the following equation (5). A tough pitch copper having the same width and the thickness as the aluminum alloy material produced was used as a tough pitch copper for comparison.

$$P = N_A/N_C \quad (5)$$

The larger the ratio P to the copper-based material for comparison, the better. A ratio P of 1.0 or more was determined as acceptable in the present Examples.

[5] Conductivity

Resistance values were measured by a four-terminal method at 20° C. according to JIS-K6271:2015. The resistance value measured was divided by the cross-section of the aluminum alloy material produced to calculate the conductivity. The higher the conductivity, the better. A conductivity of 40% IACS or more was determined as acceptable in the present Examples.

TABLE 1

| | Alloy composition [% by mass] | | | | | | Evaluation of properties | | | |
|---|---|---|---|---|---|---|---|---|---|---|
| | Mg | Si | Fe | Al and inevitable impurities | Manufacturing condition | Ratio of width to thickness | Vickers hardness | Tensile strength [MPa] | Fatigue cycle (compared with copper) | Conductivity [% IACS] |
| Example 1 | 0.63 | 0.61 | 0.21 | Balance | A | 15 | 122 | 468 | 1.9 | 48.6 |
| Example 2 | 0.63 | 0.61 | 0.21 | Balance | B | 10 | 138 | 508 | 2.2 | 48.2 |
| Example 3 | 0.63 | 0.61 | 0.21 | Balance | C | 6 | 147 | 553 | 2.7 | 47.7 |
| Example 4 | 0.63 | 0.61 | 0.21 | Balance | D | 3 | 171 | 652 | 3.5 | 47.1 |
| Example 5 | 0.63 | 0.61 | 0.21 | Balance | E | 15 | 96 | 362 | 1.2 | 55.2 |
| Example 6 | 0.63 | 0.61 | 0.21 | Balance | F | 10 | 107 | 408 | 1.5 | 52.1 |
| Example 7 | 0.63 | 0.61 | 0.21 | Balance | G | 6 | 125 | 522 | 2.1 | 51.7 |
| Example 8 | 0.63 | 0.61 | 0.21 | Balance | H | 3 | 146 | 593 | 2.5 | 53.2 |
| Example 9 | 0.25 | 1.95 | 0.11 | Balance | G | 6 | 162 | 595 | 3.1 | 46.3 |
| Example 10 | 0.22 | 0.22 | 0.15 | Balance | C | 6 | 140 | 517 | 2.5 | 51.2 |
| Example 11 | 0.63 | 0.61 | 1.42 | Balance | C | 6 | 148 | 573 | 1.6 | 48.4 |
| Example 12 | 0.91 | 0.88 | 0.15 | Balance | D | 3 | 168 | 661 | 3.2 | 46.2 |
| Example 13 | 1.76 | 0.31 | 0.11 | Balance | H | 3 | 164 | 642 | 2.9 | 46.1 |
| Comparative Example 1 | — | — | — | Balance | C | 6 | 50 | 162 | 0.1 | 61.8 |
| Comparative Example 2 | 0.17 | 0.17 | 0.21 | Balance | A | 15 | 83 | 302 | 0.8 | 51.5 |
| Comparative Example 3 | 1.82 | 2.11 | 0.21 | Balance | K | | Working cracks | | | |
| Comparative Example 4 | 0.91 | 0.88 | 1.62 | Balance | K | | Working cracks | | | |
| Comparative Example 5 | 0.63 | 0.61 | 0.21 | Balance | I | 15 | 86 | 314 | 0.8 | 54.1 |

TABLE 1-continued

| | Alloy composition [% by mass] | | | | | Evaluation of properties | | | |
|---|---|---|---|---|---|---|---|---|---|
| | Mg | Si | Fe | Al and inevitable impurities | Manufacturing condition | Ratio of width to thickness | Vickers hardness | Tensile strength [MPa] | Fatigue cycle (compared with copper) | Conductivity [% IACS] |
| Comparative Example 6 | 0.63 | 0.61 | 0.21 | Balance | J | | Working cracks | | | |

The results in Table 1 show that since the aluminum alloy materials according to Examples 1 to 13 have a specific alloy composition and a Vickers hardness (HV) of 90 or more and 190 or less, and have a ribbon shape, the aluminum alloy materials have a high strength comparable to that of iron-based materials and copper-based materials (more specifically, a tensile strength of 350 MPa or more and a ratio of the fatigue cycle to that of copper of 1.0 or more), and exhibit a conductivity as high as 40% IACS or more.

By contrast, in Comparative Example 1, since the product did not contain metal component Mg, Si or Fe, it had a Vickers hardness (HV) of 50, a tensile strength of as low as 162 MPa, and a smaller fatigue cycle than copper.

In Comparative Example 2, both the content of Mg and the content of Si were as low as 0.17% by mass, and thus the product had a Vickers hardness (HV) of 83, a tensile strength of as low as 302 MPa, and a smaller fatigue cycle than copper.

In Comparative Example 3, the content of Mg was as high as 1.82% by mass and the content of Si was as high as 2.11% by mass, and thus working cracks occurred during wire drawing working [1] and an aluminum alloy material having a ribbon shape could not be produced.

In Comparative Example 4, the content of Fe was as high as 1.62% by mass, and thus working cracks occurred during wire drawing working [1] and an aluminum alloy material having a ribbon shape could not be produced.

In Comparative Example 5, since wire drawing working [1] was performed at a degree of working of 2.0, the product had a Vickers hardness (HV) of 86, a tensile strength of as low as 314 MPa, and a smaller fatigue cycle than copper.

In Comparative Example 6, since aging precipitation heat treatment [0] was performed before wire drawing working [1], working cracks occurred during rolling working [2] and an aluminum alloy material having a ribbon shape could not be produced.

As described above, since the aluminum alloy material of the present disclosure has an alloy composition containing Mg: 0.2 to 1.8% by mass, Si: 0.2 to 2.0% by mass, and Fe: 0.01% to 1.50% by mass, with the balance being Al and inevitable impurities, has a Vickers hardness (HV) of 90 or more and 190 or less and has a ribbon shape, the aluminum alloy material has a high strength comparable to that of iron-based materials and copper-based materials, and has a high conductivity. Therefore, the aluminum alloy material of the present disclosure may be used for a conductive member, a conductive component, a spring member, a spring component, a semiconductor module member, a semiconductor module component, a structural member, a structural component and the like.

Examples 14 to 29, Comparative Examples 7 to 14

First, 10 mm φ bars having the alloy composition shown in Table 2 were prepared in Examples 14 to 29 and Comparative Examples 8 to 14. A 10 mm φ bar made of 99.99% by mass of Al was prepared in Comparative Example 7. Next, an aluminum alloy material having a ribbon shape was produced under the manufacturing condition shown in Table 2 using the respective bars.

Manufacturing conditions A to J shown in Table 2 are specifically as follows. The degree of working and width expansion ratio S are as shown in equation (1) and equation (3) above.

<Manufacturing Condition A>

The bar prepared was subjected to wire drawing working [1] at a degree of working of 5.5. Then, rolling working [2] was performed at a width expansion ratio S of 3.0. Finishing drawing working [3] and refine annealing [4] were not performed. The ratio of the width to the thickness of the aluminum alloy material produced was 15 times.

<Manufacturing Condition B>

An aluminum alloy material was produced under the same condition as in Manufacturing condition A except that the degree of working in wire drawing working [1] was 6.5. The ratio of the width to the thickness of the aluminum alloy material produced was 10 times.

<Manufacturing Condition C>

The bar prepared was subjected to wire drawing working [1] at a degree of working of 7.5. Then, rolling working [2] was performed at a width expansion ratio S of 2.5. Finishing drawing working [3] and refine annealing [4] were not performed. The ratio of the width to the thickness of the aluminum alloy material produced was 6 times.

<Manufacturing Condition D>

The bar prepared was subjected to wire drawing working [1] at a degree of working of 10.0. Then, rolling working [2] was performed at a width expansion ratio S of 2.0. Finishing drawing working [3] and refine annealing [4] were not performed. The ratio of the width to the thickness of the aluminum alloy material produced was 3 times.

<Manufacturing Condition E>

The bar prepared was subjected to wire drawing working [1] at a degree of working of 5.5. Then, rolling working [2] was performed at a width expansion ratio S of 3.0. Finishing drawing working [3] was not performed. Refine annealing [4] was performed at 155° C. for 40 hours. The ratio of the width to the thickness of the aluminum alloy material produced was 15 times.

<Manufacturing Condition F>

The bar prepared was subjected to wire drawing working [1] at a degree of working of 6.5. Then, rolling working [2] was performed at a width expansion ratio S of 3.0. Then, finishing drawing working [3] was performed and refine annealing [4] was performed at 140° C. for 1 hour. The ratio of the width to the thickness of the aluminum alloy material produced was 10 times.

<Manufacturing Condition G>

The bar prepared was subjected to wire drawing working [1] at a degree of working of 7.5. Then, rolling working [2] was performed at a width expansion ratio S of 2.5. Finishing drawing working [3] was not performed. Refine annealing

[4] was performed at 80° C. for 24 hours. The ratio of the width to the thickness of the aluminum alloy material produced was 6 times.

<Manufacturing Condition H>

The bar prepared was subjected to wire drawing working [1] at a degree of working of 10. Then, rolling working [2] was performed at a width expansion ratio S of 2.0. Finishing drawing working [3] was not performed. Refine annealing [4] was performed at 100° C. for 24 hours. The ratio of the width to the thickness of the aluminum alloy material produced was 3 times.

<Manufacturing Condition I>

An aluminum alloy material was produced under the same condition as in Manufacturing condition E except that the degree of working in wire drawing working [1] was 2.0. The ratio of the width to the thickness of the aluminum alloy material produced was 15 times.

<Manufacturing Condition J>

The bar prepared was subjected to aging precipitation heat treatment [0] at a treatment temperature of 180° C. for a retention time of 5 hours. Subsequently, the bar was subjected to wire drawing working [1] at a degree of working of 5.5 and rolling working [2] at a width expansion ratio S of 3.5. In Comparative Example 13, working cracks occurred at many portions during rolling working [2] and thus the work was discontinued.

<Manufacturing Condition K>

The bar prepared was subjected to wire drawing working [1]. In Comparative Examples 9 to 11, working cracks occurred at many portions during wire drawing working [1] and thus the work was discontinued.

[Evaluation]

Properties of the aluminum alloy materials according to Examples and Comparative Examples above were evaluated as shown below. Conditions of evaluation of the respective properties are as follows. The results are shown in Table 2.

[1] Alloy Composition

The alloy composition was analyzed by emission spectroscopy according to JIS H1305:2005. The measurement was performed using an emission spectrophotometer (manufactured by Hitachi High-Tech Science Corporation).

[2] Vickers Hardness (HV)

Vickers hardness (HV) was measured by using microhardness tester HM-125 (manufactured by Akashi Corporation (current Mitutoyo Corporation)) according to JIS Z2244:2009. In the test, the test force was 0.1 kgf (0.98 N) and the retention time was 15 seconds. The measurement position was a position near the middle between the center and the surface layer in a cross-section parallel to the longitudinal direction of the aluminum alloy material produced (a position to the center by about ¼ from the surface layer). The average value of the measured values at 5 positions was calculated. When the difference between the maximum and the minimum of the measured values was 10 or more, the number of the materials to be measured was increased, and the average value of the measured values at 10 positions was calculated. The higher the Vickers hardness (HV), the better. A Vickers hardness (HV) of 90 or more was determined as acceptable in the present Examples.

[3] Tensile Strength

A tensile test was performed according to JIS Z2241:2011 using a precision universal tester (manufactured by Shimadzu Corporation) to measure tensile strength (MPa). The above test was performed in a condition of a distance between measured points of 10 cm and a deformation rate of 10 mm/minute. The tensile strength of three pieces of the aluminum alloy materials produced and aluminum alloy materials which were heated at 120° C. for 30 minutes after production was measured, and the average value thereof was calculated. The higher the tensile strength, the better. An aluminum alloy material before heating having a tensile strength of 350 MPa or more was determined as acceptable in the present Examples. An aluminum alloy material after heating having a tensile strength of 90% or more of that of the aluminum alloy material before heating was determined as acceptable: "◯." Those having a tensile strength of less than 90% of that of the aluminum alloy material before heating was determined as not acceptable: "x."

[4] Fatigue Cycle

A test was performed in an alternating condition according to Technical Standard JCBA-T308 (2002) of the Japan Copper and Brass Association. For set length L of the specimen, a condition of applying a bending stress of 300 MPa to a copper-based material having a Young's modulus of 125 GPa was used. L is represented as:

$$L = 36.06 \times \sqrt{t} \quad (4)$$

Using the square root of plate thickness t. For the aluminum alloy materials produced, number of repetitions $N_A$ until the material was broken in the above condition was determined. Next, a tough pitch copper having a ribbon shape was subjected to a measurement under the same condition to determine number of repetitions $N_C$. Then, the ratio of the two, P, was calculated as in the following equation (5). A tough pitch copper having the same width and the thickness as the aluminum alloy material produced was used as a tough pitch copper for comparison.

$$P = N_A/N_C \quad (5)$$

The larger the ratio P to the copper-based material for comparison, the better. A ratio P of 1.0 or more was determined as acceptable in the present Examples.

TABLE 2

| | Alloy composition [% by mass] | | | | | | | | Evaluation of properties | | | | |
| --- | --- | --- | --- | --- | --- | --- | --- | --- | --- | --- | --- | --- | --- |
| | | | | At least one selected element from Ti, B, Cu, Ag, Zn, Ni, Co, Au, Mn, Cr, V, Zr, and Sn | | | Al and inevitable | Manufacturing | Ratio of width | Vickers | Tensile strength | | Fatigue cycle (compared with |
| | Mg | Si | Fe | 1 | 2 | total | impurities | condition | to thickness | hardness | Before heating [MPa] | After heating | copper) |
| Example 14 | 0.63 | 0.61 | 0.21 | Cu 0.71 | Ni 0.32 | 1.03 | Balance | H | 3 | 170 | 638 | ◯ | 3.1 |
| Example 15 | 0.63 | 0.61 | 0.21 | Cu 1.21 | Ag 0.71 | 1.92 | Balance | F | 10 | 151 | 553 | ◯ | 2.5 |
| Example 16 | 0.63 | 0.61 | 0.21 | Ag 0.35 | V 0.08 | 0.43 | Balance | G | 6 | 155 | 571 | ◯ | 2.2 |

TABLE 2-continued

| | Alloy composition [% by mass] | | | | | | | | Evaluation of properties | | | |
|---|---|---|---|---|---|---|---|---|---|---|---|---|
| | | | | At least one selected element from Ti, B, Cu, Ag, Zn, Ni, Co, Au, Mn, Cr, V, Zr, and Sn | | | Al and inevitable impurities | Manufacturing condition | Ratio of width to thickness | Vickers hardness | Tensile strength | | Fatigue cycle (compared with copper) |
| | Mg | Si | Fe | 1 | 2 | total | | | | | Before heating [MPa] | After heating | |
| Example 17 | 0.63 | 0.61 | 0.21 | Ag 0.55 | Sn 0.05 | 0.6 | Balance | D | 3 | 170 | 640 | ○ | 3.2 |
| Example 18 | 0.63 | 0.61 | 0.21 | Zn 0.11 | Zr 0.06 | 0.17 | Balance | A | 15 | 125 | 454 | ○ | 1.7 |
| Example 19 | 0.63 | 0.61 | 0.21 | Au 0.11 | Cu 0.11 | 0.22 | Balance | B | 10 | 150 | 542 | ○ | 2.2 |
| Example 20 | 0.63 | 0.61 | 0.21 | Mn 0.11 | Co 0.11 | 0.22 | Balance | E | 15 | 95 | 370 | ○ | 1.2 |
| Example 21 | 0.22 | 0.22 | 0.15 | Cu 0.07 | Cr 0.07 | 0.14 | Balance | C | 6 | 149 | 556 | ○ | 2.4 |
| Example 22 | 0.22 | 1.95 | 0.11 | Zn 0.13 | — | 0.13 | Balance | G | 6 | 168 | 632 | ○ | 3.3 |
| Example 23 | 0.63 | 0.61 | 1.42 | Cu 0.07 | Sn 0.04 | 0.11 | Balance | C | 6 | 160 | 603 | ○ | 2.2 |
| Example 24 | 0.91 | 0.88 | 0.15 | Cu 0.07 | — | 0.07 | Balance | D | 3 | 180 | 685 | ○ | 3.1 |
| Example 25 | 0.98 | 0.6 | 0.07 | Cu 0.28 | Cr 0.14 | 0.42 | Balance | C | 6 | 150 | 575 | ○ | 2.9 |
| Example 26 | 1.76 | 0.31 | 0.11 | Ag 0.12 | — | 0.12 | Balance | H | 3 | 170 | 644 | ○ | 3.2 |
| Example 27 | 0.63 | 0.61 | 0.21 | Ti 0.01 | B 0.01 | 0.02 | Balance | F | 10 | 108 | 410 | ○ | 1.5 |
| Example 28 | 0.63 | 0.61 | 0.21 | Ti 0.01 | B 0.01 | 0.02 | Balance | G | 6 | 126 | 525 | ○ | 2.1 |
| Example 29 | 0.63 | 0.61 | 0.21 | Ti 0.01 | B 0.01 | 0.02 | Balance | H | 3 | 148 | 596 | ○ | 2.5 |
| Comparative Example 7 | — | — | — | — | | | Balance | C | 6 | 43 | 150 | x | 0.1 |
| Comparative Example 8 | 0.17 | 0.17 | 0.21 | Cu 0.07 | — | 0.07 | Balance | A | 15 | 85 | 326 | x | 0.8 |
| Comparative Example 9 | 1.82 | 2.11 | 0.21 | Cu 0.07 | — | 0.07 | Balance | K | Working cracks | | | | |
| Comparative Example 10 | 0.91 | 0.88 | 1.62 | Cu 0.07 | — | 0.07 | Balance | K | Working cracks | | | | |
| Comparative Example 11 | 0.63 | 0.61 | 0.21 | Cu 1.81 | Zr 0.28 | 2.09 | Balance | K | Working cracks | | | | |
| Comparative Example 12 | 0.63 | 0.61 | 0.21 | Cu 0.28 | Cr 0.14 | 0.42 | Balance | I | 15 | 87 | 330 | ○ | 0.8 |
| Comparative Example 13 | 0.63 | 0.61 | 0.21 | Cu 0.28 | Cr 0.14 | 0.42 | Balance | J | Working cracks | | | | |
| Comparative Example 14 | 0.63 | 0.61 | 0.21 | | — | | Balance | C | 6 | 146 | 560 | x | 2.7 |

The results in Table 2 show that since the aluminum alloy materials according to Examples 14 to 29 have a specific alloy composition and a Vickers hardness (HV) of 90 or more and 190 or less, and have a ribbon shape, the aluminum alloy materials have a high strength comparable to that of iron-based materials and copper-based materials (more specifically, a tensile strength of 350 MPa or more and a ratio of the fatigue cycle to that of copper of 1.0 or more). The results also show that since the aluminum alloy materials according to Examples 14 to 29 contain a pre-determined amount of at least one element selected from Ti, B, Cu, Ag, Zn, Ni, Co, Au, Mn, Cr, V, Zr and Sn, the aluminum alloy materials maintain high tensile strength even after heating and have excellent heat resistance.

By contrast, in Comparative Example 7, since the product did not contain metal component Mg, Si or Fe, it had a Vickers hardness (HV) of 43, a tensile strength of as low as 150 MPa, and a smaller fatigue cycle than copper. Furthermore, the product had poor heat resistance.

In Comparative Example 8, both the content of Mg and the content of Si were as low as 0.17% by mass, and thus the product had a Vickers hardness (HV) of 85, a tensile strength of 325 MPa, and a smaller fatigue cycle than copper. Furthermore, the product had poor heat resistance.

In Comparative Example 9, the content of Mg was as high as 1.82% by mass and the content of Si was as high as 2.11% by mass, and thus working cracks occurred during wire drawing working [1] and an aluminum alloy material having a ribbon shape could not be produced.

In Comparative Example 10, the content of Fe was as high as 1.62% by mass, and thus working cracks occurred during wire drawing working [1] and an aluminum alloy material having a ribbon shape could not be produced.

In Comparative Example 11, the total content of at least one element selected from Ti, B, Cu, Ag, Zn, Ni, Co, Au, Mn, Cr, V, Zr and Sn was as high as 2.09% by mass, and thus working cracks occurred during wire drawing working [1] and an aluminum alloy material having a ribbon shape could not be produced.

In Comparative Example 12, since wire drawing working [1] was performed at a degree of working of 2.0, the product had a Vickers hardness (HV) of 87, a tensile strength of as low as 330 MPa, and a smaller fatigue cycle than copper.

In Comparative Example 13, since aging precipitation heat treatment [0] was performed before wire drawing working [1], working cracks occurred during rolling working [2] and an aluminum alloy material having a ribbon shape could not be produced.

In Comparative Example 14, since the product did not contain at least one element selected from Ti, B, Cu, Ag, Zn, Ni, Co, Au, Mn, Cr, V, Zr and Sn, the product had poor heat resistance.

As described above, since the aluminum alloy material of the present disclosure has an alloy composition containing Mg: 0.2 to 1.8% by mass, Si: 0.2 to 2.0% by mass, Fe: 0.01% to 1.50% by mass, and at least one element selected from Ti, B, Cu, Ag, Zn, Ni, Co, Au, Mn, Cr, V, Zr and Sn: more than 0.00 to 2% by mass in total, with the balance being Al and inevitable impurities, has a Vickers hardness (HV) of 90 or more and 190 or less and has a ribbon shape, the aluminum alloy material has high strength comparable to that of iron-based materials and copper-based materials, and has heat resistance. Therefore, the aluminum alloy material of the present disclosure may be used for a conductive member, a conductive component, a spring member, a spring component, a semiconductor module member, a semiconductor module component, a structural member, a structural component and the like.

What is claimed is:

1. An aluminum alloy material having an alloy composition comprising Mg: 0.2% to 1.8% by mass, Si: 0.2% to 2.0% by mass, and Fe: 0.01% to 1.50% by mass, with the balance being Al and inevitable impurities,
wherein the aluminum alloy material has a Vickers hardness (HV) of 90 or more and 190 or less and has a ribbon shape,
wherein an end face in a width direction is in a form of a convex curved surface,
wherein the width direction is perpendicular to a longitudinal direction of the aluminum alloy material.

2. The aluminum alloy material according to claim 1,
wherein the aluminum alloy material has a Vickers hardness (HV) of 115 or more and 190 or less.

3. The aluminum alloy material according to claim 1,
wherein the aluminum alloy material is coated with at least one metal selected from the group consisting of Cu, Ni, Ag, Sn, Au and Pd.

4. A conductive member comprising the aluminum alloy material according to claim 1.

5. A conductive component comprising the conductive member according to claim 4.

6. A spring member comprising the aluminum alloy material according to claim 1.

7. A spring component comprising the spring member according to claim 6.

8. A semiconductor module member comprising the aluminum alloy material according to claim 1.

9. A semiconductor module component comprising the semiconductor module member according to claim 8.

10. A structural member comprising the aluminum alloy material according to claim 1.

11. A structural component comprising the structural member according to claim 10.

12. An aluminum alloy material having an alloy composition comprising Mg: 0.2 to 1.8% by mass, Si: 0.2 to 2.0% by mass, Fe: 0.01 to 1.50% by mass, and at least one element selected from Ti, B, Cu, Ag, Zn, Ni, Co, Au, Mn, Cr, V, Zr and Sn: 0.00 to 2% by mass in total, with the balance being Al and inevitable impurities,
wherein the aluminum alloy material has a Vickers hardness (HV) of 90 or more and 190 or less and has a ribbon shape,
wherein an end face in a width direction is in a form of a convex curved surface,
wherein the width direction is perpendicular to a longitudinal direction of the aluminum alloy material.

13. An aluminum alloy material having an alloy composition comprising Mg: 0.2 to 1.8% by mass, Si: 0.2 to 2.0% by mass, 0.01 to 1.50% by mass, and at least one element selected from Ti, B, Cu, Ag, Zn, Ni, Co, Au, Mn, Cr, V, Zr and Sn: 0.02 to 2% by mass in total, with the balance being Al and inevitable impurities,
wherein the aluminum alloy material has a Vickers hardness (HV) of 90 or more and 190 or less and has a ribbon shape,
wherein an end face in a width direction is in a form of a convex curved surface,
wherein the width direction is perpendicular to a longitudinal direction of the aluminum alloy material.

* * * * *